US009488686B2

(12) United States Patent
Bhandarkar et al.

(10) Patent No.: US 9,488,686 B2
(45) Date of Patent: Nov. 8, 2016

(54) FILTER CAPACITOR DEGRADATION IDENTIFICATION USING COMPUTED CURRENT

(71) Applicants: Santosh Manjunath Bhandarkar, Cedarburg, WI (US); Sinuhe Imuris Benitez Escobar, Mequon, WI (US)

(72) Inventors: Santosh Manjunath Bhandarkar, Cedarburg, WI (US); Sinuhe Imuris Benitez Escobar, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 350 days.

(21) Appl. No.: 14/187,972

(22) Filed: Feb. 24, 2014

(65) Prior Publication Data

US 2015/0241503 A1    Aug. 27, 2015

(51) Int. Cl.
| G01R 31/02 | (2006.01) |
| H02M 1/12 | (2006.01) |
| H02M 5/458 | (2006.01) |
| G01R 31/42 | (2006.01) |

(52) U.S. Cl.
CPC ............ *G01R 31/028* (2013.01); *H02M 1/126* (2013.01); *H02M 5/4585* (2013.01); *G01R 31/42* (2013.01)

(58) Field of Classification Search
CPC ... H02M 1/126; H02M 5/4585; H02M 7/219
See application file for complete search history.

(56) References Cited

U.S. PATENT DOCUMENTS

| 4,419,621 A | 12/1983 | Becker |
| 4,721,916 A | 1/1988 | Hanasawa |
| 5,319,513 A | 6/1994 | Lowenstein et al. |
| 5,491,725 A | 2/1996 | White |
| 5,796,258 A | 8/1998 | Yang |
| 5,804,973 A | 9/1998 | Shinohara |
| 6,166,929 A | 12/2000 | Ma et al. |
| 6,269,010 B1 | 7/2001 | Ma et al. |
| 6,366,483 B1 | 4/2002 | Ma et al. |
| 6,525,951 B1 | 2/2003 | Paice |
| 6,642,689 B2 | 11/2003 | Ishida et al. |
| 6,667,866 B1 | 12/2003 | LaPlace |
| 7,274,576 B1 | 9/2007 | Zargari et al. |

(Continued)

FOREIGN PATENT DOCUMENTS

| CN | 201393056 Y | 1/2010 |
| EP | 2299568 A1 | 3/2011 |

(Continued)

OTHER PUBLICATIONS

Rodriguez-Valdez, et al., "Phase Locked Loop for Unbalanced Utility Conditions", 2010 Applied Power Electronics Conference and Exposition (APEC), 2010 25$^{th}$ Annual IEEE 2010, Piscataway, NJ, Feb. 21, 2010, pp. 634-641.

(Continued)

*Primary Examiner* — Emily P Pham
(74) *Attorney, Agent, or Firm* — Fay Sharpe LLP

(57) ABSTRACT

Methods and apparatus are presented for detecting filter capacitor degradation in a power converter in which filter circuit branch currents and voltages are concurrently measured, nominal current values are automatically computed according to the measured voltages, the operating frequency and nominal capacitance values, and current change values are calculated based on the difference between the measured currents and the calculated nominal currents, and the change values are evaluated to selectively identify filter capacitor degradation conditions in the filter circuit.

17 Claims, 7 Drawing Sheets

(56) References Cited

U.S. PATENT DOCUMENTS

| | | |
|---|---|---|
| 7,309,973 B2 | 12/2007 | Garza |
| 7,495,410 B2 | 2/2009 | Zargari et al. |
| 7,495,938 B2 | 2/2009 | Wu et al. |
| 7,511,976 B2 | 3/2009 | Zargari et al. |
| 7,616,005 B2 | 11/2009 | Kalyuzhny et al. |
| 7,683,568 B2 | 3/2010 | Pande et al. |
| 7,764,523 B2 | 7/2010 | Conticelli et al. |
| 7,782,009 B2 | 8/2010 | Wiseman |
| 7,786,735 B2 | 8/2010 | Kalyuzhny et al. |
| 7,800,348 B2 | 9/2010 | Zargari |
| 7,812,615 B2 | 10/2010 | Gajic et al. |
| 7,818,137 B2 | 10/2010 | Agarwal |
| 7,990,097 B2 | 8/2011 | Cheng et al. |
| 8,009,450 B2 | 8/2011 | Royak et al. |
| 8,030,791 B2 | 10/2011 | Lang et al. |
| 8,044,631 B2 | 10/2011 | Dai et al. |
| 8,183,874 B2 | 5/2012 | Dommaschk |
| 8,259,426 B2 | 9/2012 | Xiao et al. |
| 8,259,480 B2 | 9/2012 | Hasler |
| 8,350,397 B2 | 1/2013 | Lang et al. |
| 8,352,203 B2 | 1/2013 | Seibel et al. |
| 8,395,910 B2 | 3/2013 | Alexander |
| 8,400,800 B2 | 3/2013 | Alexander |
| 8,587,160 B2 | 11/2013 | Dai et al. |
| 8,643,383 B2 | 2/2014 | Xiao |
| 8,648,610 B2 | 2/2014 | Mikami |
| 8,698,507 B2 * | 4/2014 | Huang ............... G01R 31/028 324/548 |
| 8,729,844 B2 | 5/2014 | Feng et al. |
| 2001/0017489 A1 | 8/2001 | Inoue et al. |
| 2004/0257093 A1 | 12/2004 | Sakiyama |
| 2006/0232471 A1 * | 10/2006 | Coumou ........... H01J 37/32082 342/450 |
| 2009/0072982 A1 | 3/2009 | Cheng et al. |
| 2010/0161259 A1 | 6/2010 | Kim et al. |
| 2012/0271572 A1 | 10/2012 | Xiao |
| 2013/0057297 A1 | 3/2013 | Cheng |
| 2013/0076151 A1 | 3/2013 | Bae et al. |
| 2013/0120038 A1 | 5/2013 | Kerkman et al. |
| 2013/0120039 A1 | 5/2013 | Kerkman et al. |
| 2013/0279214 A1 | 10/2013 | Takase et al. |
| 2013/0286692 A1 | 10/2013 | Patel et al. |
| 2014/0012552 A1 | 1/2014 | Zik |
| 2014/0217980 A1 | 8/2014 | Malrieu |
| 2014/0320056 A1 | 10/2014 | Royak |
| 2015/0092460 A1 | 4/2015 | Tallam |
| 2015/0155794 A1 | 6/2015 | Long |
| 2015/0241503 A1 | 8/2015 | Bhandarkar |
| 2015/0263600 A1 | 9/2015 | Bhandarkar |

FOREIGN PATENT DOCUMENTS

| | | |
|---|---|---|
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO2012044737 A1 | 4/2012 |
| WO | WO2012110087 A1 | 8/2012 |
| WO | WO2012110088 A1 | 8/2012 |
| WO | WO 2013/038098 | 3/2013 |

OTHER PUBLICATIONS

European Search Report completed Jul. 20, 2015 for Application No. EP 15 15 6270.
Bhattacharya, "Basic Electrical and Electronics Engineering", Aug. 18, 2011, 10 pgs.
ABB Bay Control REC670 Application manual, Relion 670 series, http://www05./abb.com/global/scot/scot354.nsf, Oct. 10, 2011, pp. 1-586 (2 parts).
Transformer protection RET670 ANSI Application manual, Relion 670 series, http://www.abb.com/product/db0003db004281/c12573e700330419c/257f000263ad5.aspx#I, May 6, 2011, pp. 1-864 (2 parts).
"Protective Relays", iCP-630 Capacitor Bank Protection Relay, Cooper Power Systems, Jan. 2011, pp. 1-8.
ABB Distribution Automation Handbook, Section 8.10 Protection of Capacitor Banks, Mar. 5, 2011.
GE C70 Capacitor Bank Protection and Control System UR Series Instruction Manual C70 Revision: 6.0x, Copyright @ 2011, GE Multilin, http://www.GEmultilin.com, pp. 1-644 (2 parts).
"iCP-630 Capacitor Bank Protection Relay", Cooper Power Systems, Mar. 2007.
U.S. Appl. No. 13/570,781, "Filter Capacitor Degradation Detection Apparatus and Method", by Patel et al., filed Aug. 9, 2012.
U.S. Appl. No. 13/872,177, "Active Front End Filter Capacitor Failure Prediction With Y and Delta Capacitor Connection", by Royak et al., filed Apr. 29, 2013.
U.S. Appl. No. 14/042,753, "Method and Apparatus for Detecting AFE Filter Capacitor Degradation", by Tallam et al., filed Oct. 1, 2013.
U.S. Appl. No. 14/095,169, "Impedance Detector Apparatus and Method", by Kerkman et al., filed Dec. 3, 2013.
Lee, et al., "Online capacitance estimation of DC-link electrolytic capacitors for three-phase AC/DC/AC PWM converters using recursive least squares method", IEE Proc.-Electr, Power Appl., vol. 152, No. 6, Nov. 2005.

* cited by examiner

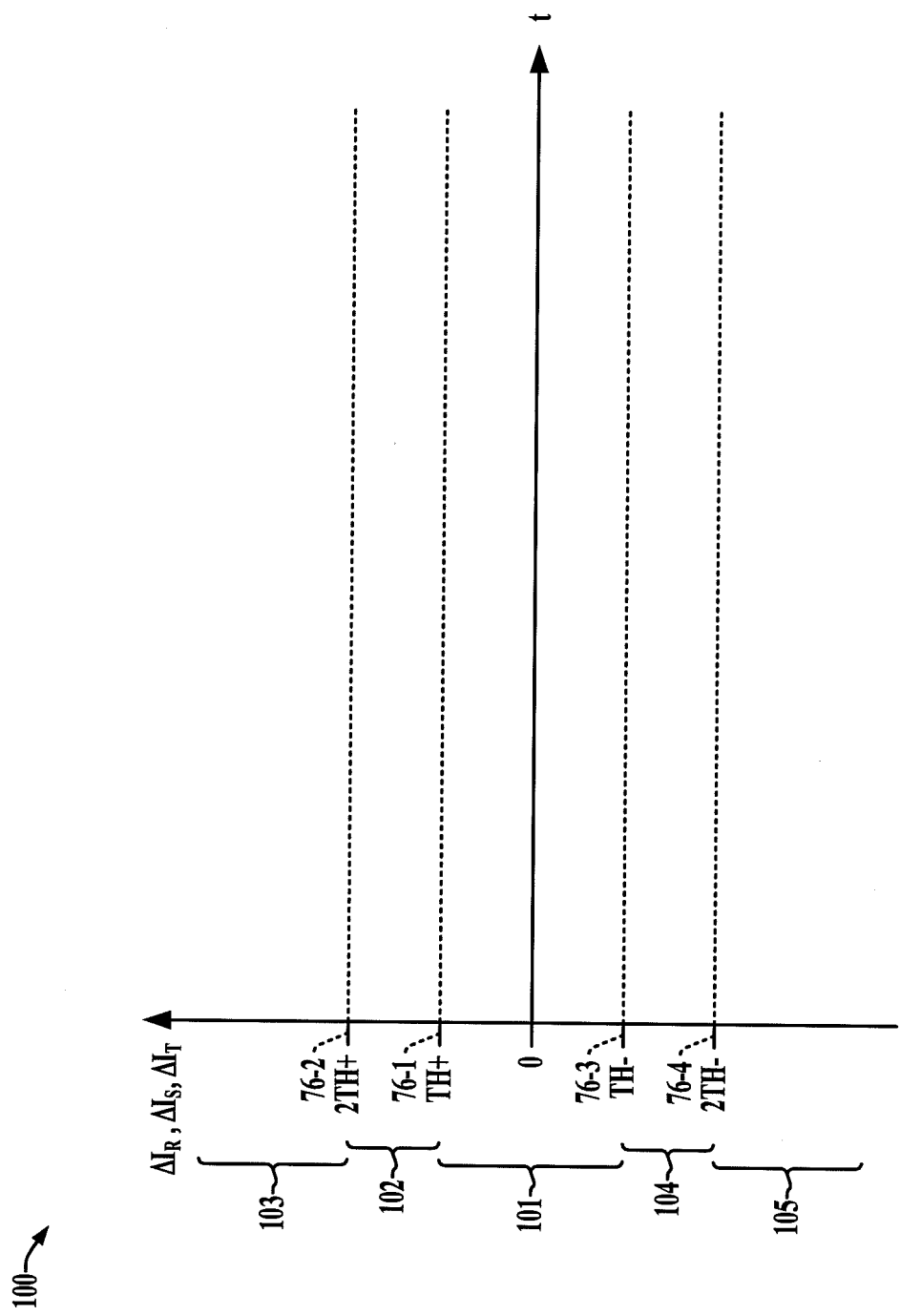

FILTER CAPACITOR DEGRADATION IDENTIFICATION USING COMPUTED CURRENT

BACKGROUND INFORMATION

The subject matter disclosed herein relates to a power conversion, and more specifically to apparatus and techniques for detection of degraded filter circuit capacitor components.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

In one embodiment, a method is disclosed, including measuring filter circuit branch currents and filter circuit voltages, as well as computing nominal filter circuit branch currents using the measured voltages, a filter operating frequency, and one or more nominal capacitance values. The method further includes computing current change values representing deviations of the measured currents from the corresponding nominal currents, and selectively identifying filter capacitor degradation at least partially according to the current change values.

In one embodiment, a non-transitory computer readable medium is disclosed, having computer-executable instructions for computing nominal filter circuit branch currents using measured filter circuit voltages, a filter operating frequency, and at least one nominal capacitance value, computing current change values representing deviations of individual measured filter circuit branch currents from the corresponding nominal filter circuit branch currents, and selectively identifying a filter capacitor degradation condition at least partially according to the current change values.

In one embodiment, a power converter is disclosed, including a filter circuit, a measurement circuit configured to measure filter circuit branch currents and filter circuit voltages associated with the filter circuit, and at least one processor programmed to compute nominal filter circuit branch currents using the measured filter circuit voltages, a filter operating frequency and at least one nominal capacitance value, to compute current change values representing deviations of individual measured filter circuit branch currents from the corresponding nominal filter circuit branch currents, and to selectively identify a filter capacitor degradation condition at least partially according to the current change values.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 3 is a graph illustrating exemplary thresholds of the degradation detection system of FIGS. 1 and 2 according to one embodiment;

DETAILED DESCRIPTION

Figure 1:
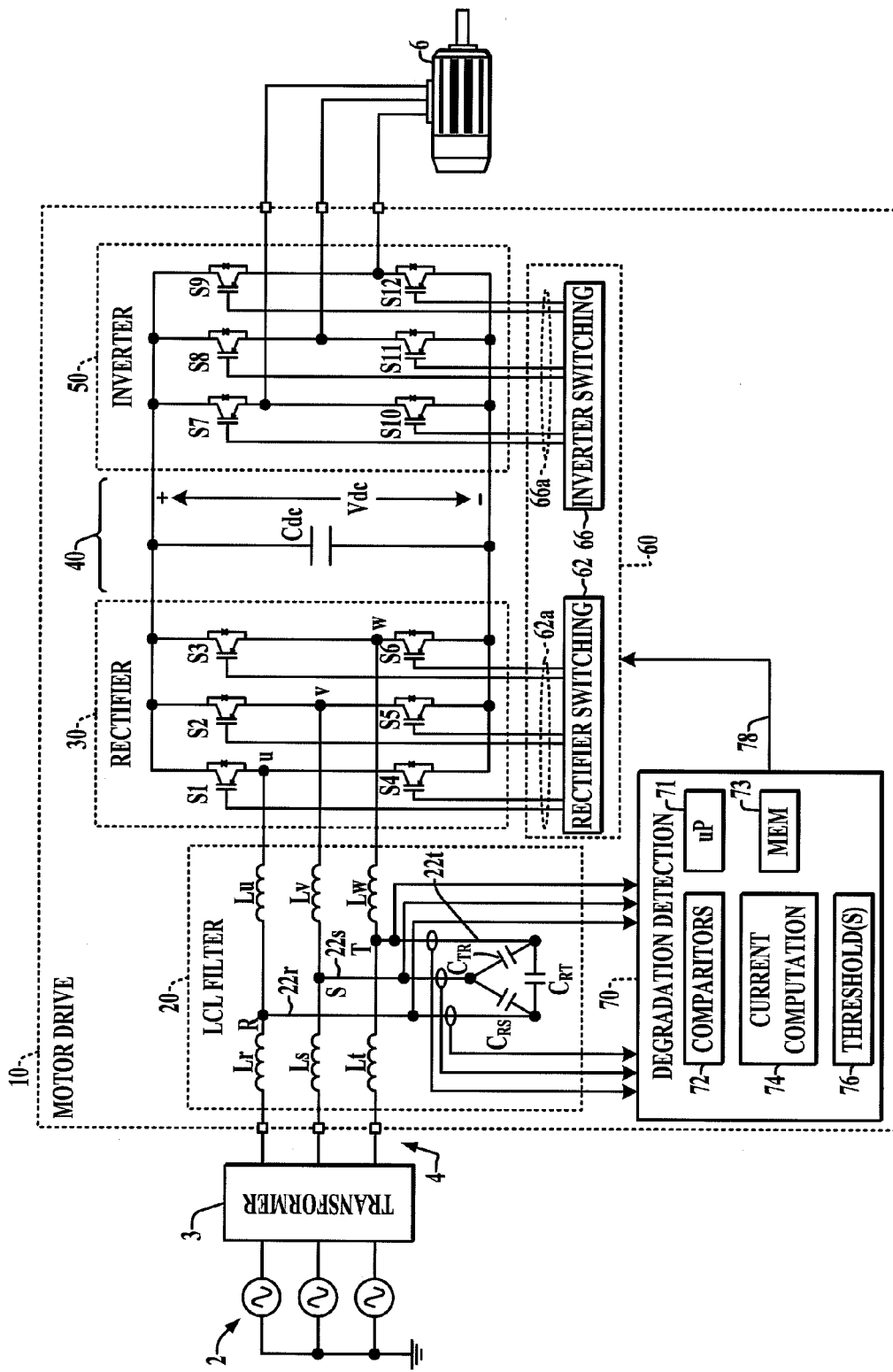
FIG. 1 is a schematic diagram illustrating an exemplary active front end (AFE) motor drive including an input LCL filter with delta-connected filter capacitors as well as filter capacitor degradation detection apparatus according to one embodiment.

Referring now to the figures, one or more embodiments or implementations are hereinafter described in conjunction with the drawings, wherein the various features are not necessarily drawn to scale. Motor drives and other power converters operate using power from AC power sources, and an input filter circuit may be provided to reduce switching noise associated with operation of the power converter, and particularly to control total harmonic distortion (THD) generated by high frequency operation of certain active front end rectifiers. In particular, inductor-capacitor (L-C) or inductance-capacitance-inductance (L-C-L) input filter circuitry may be associated with each AC input phase to control the harmonic content of a connected power grid. The capacitors in such filter circuits, however, may be subject to damage or degradation, and such degradation may be costly in terms of replacement component costs, labor for inspection and replacement, as well as downtime for the power converter and any associated machinery to manually identify one or more degraded capacitors. Moreover, capacitor degradation may not be identifiable through simple visual inspection by service personnel. Fuses may be placed in line with the filter circuit capacitors, but the fuses may not open quickly enough to prevent capacitor degradation or may open frequently in normal operation with healthy capacitors, leading to excessive system downtime and further costs for inspection and system verification. The present disclosure provides filter capacitor degradation identification solutions that find particular utility in connection with active front end power converters and other power converters, as well as in other filter circuit applications.

Methods and apparatus are hereinafter disclosed for active front end power converter filter capacitor degradation detection in which filter circuit branch currents and voltages are concurrently measured, and nominal filter circuit current values are automatically computed according to the measured voltages, the operating frequency and nominal capacitance values. Current change values are calculated based on the difference between the measured currents and the calculated nominal currents, and are assessed to facilitate selective identification or detection of filter capacitor degradation conditions in the filter circuit. The disclosure thus presents a significant advance since no fuses are used and the onset of degradation can be assessed prior to system damage. The detected degradation condition can be used, in turn, to provide a system alert or warning and/or to shut down the power converter in certain non-limiting applications. The disclosed concepts find utility in association with active front end motor drives as well as other forms of power converters. In addition, although illustrated in the context of three-phase input devices, the disclosed concepts can be employed in power converters having any number of input phases in which a filter includes a capacitor circuit or capacitor bank. The disclosed techniques and apparatus advantageously facilitate identification of potential degradation of the individual filter capacitors, and a determination can be made as to whether one or more of these components are degrading in certain embodiments. The degradation detection, moreover, can be used to initiate any appropriate remedial or reporting action. In this manner, the present disclosure avoids the over inclusive or under inclusive nature of protective fuse-based solutions, and also advantageously facilitates early identification of the onset of component degradation filter capacitors. This, in turn, can facilitate reduction in system downtime and reduce or mitigate maintenance costs associated with operation of a motor drive or other power converter.

Figure 2:
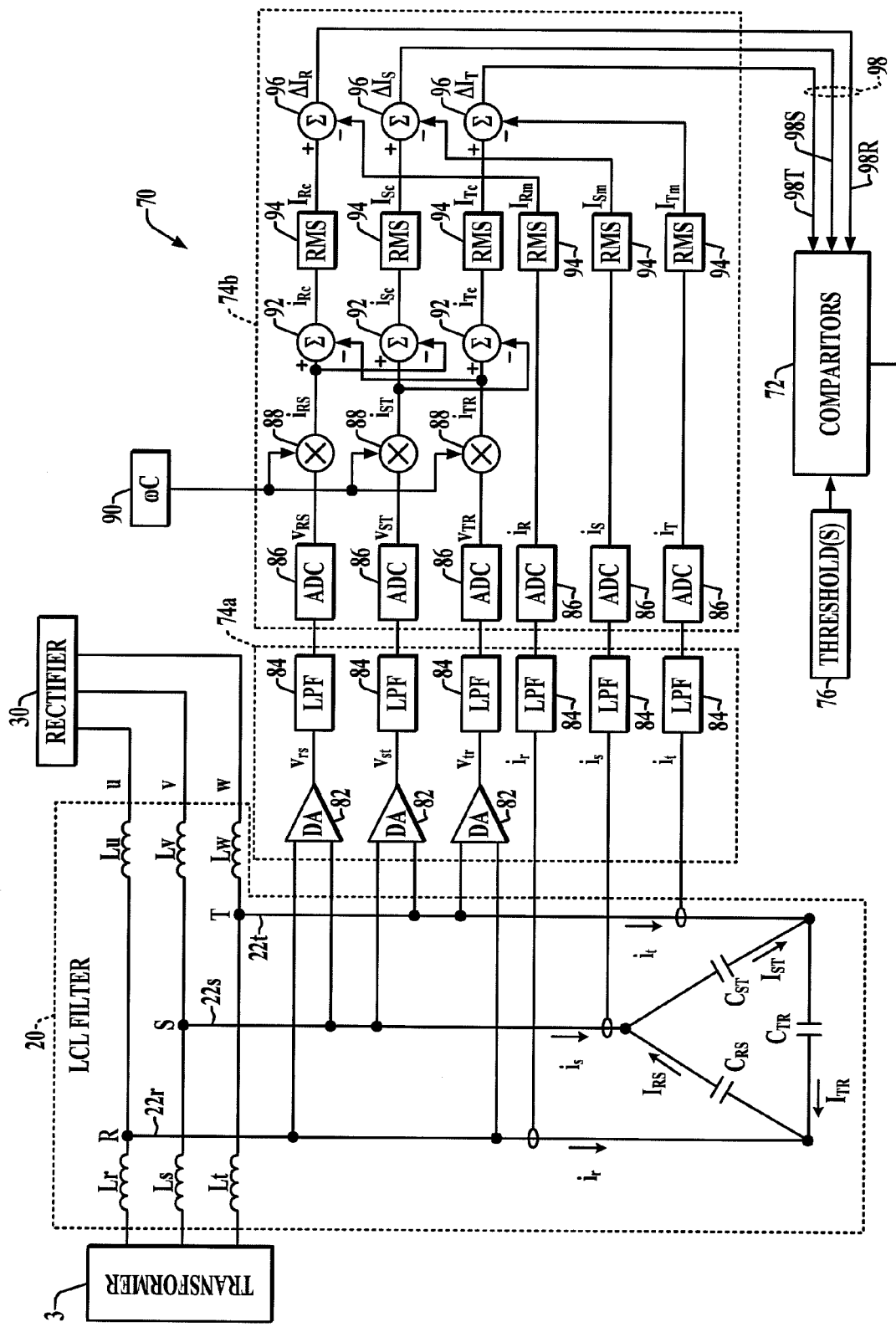
FIG. 2 is a partial schematic diagram illustrating further details of an exemplary degradation detection system in the motor drive of FIG. 1 according to one embodiment.

Referring initially to FIGS. 1 and 2, FIG. 1 illustrates an exemplary active front end motor drive 10 and FIG. 2 depicts an exemplary degradation detection system 70 in the motor drive 10 of FIG. 1 according to one embodiment. The motor drive 10 in FIG. 1 includes a three phase AC input 4 receiving input power from a three-phase source 2 via an optional transformer 3, where the drive 10 includes a rectifier 30, an intermediate DC link circuit 40 and an output inverter 50 providing variable frequency, variable amplitude AC output power to drive a motor load 6. Although illustrated and described in the context of a motor drive type power converter 10, the various disclosed concepts can be employed in other forms of power converters, whether providing an AC output or a DC output to drive a motor or other type of load 6. The drive input 4 in the illustrated non-limiting example has three input phase terminals which are connected through an LCL input filter circuit 20 to the AC input of the switching (e.g., active front end) rectifier 30. Although the filter circuit 20 in FIGS. 1 and 2 is an "L-C-L" filter having two inductors in each series circuit path between the input 4 and the rectifier 30, the various concepts of the present disclosure can be employed in connection with other filter circuit topologies including without limitation L-C filters, C-L filters, etc. In the illustrated example of FIGS. 1 and 2, the filter circuit 20 includes a set or bank of three capacitors $C_{RS}$, $C_{ST}$ and $C_{TR}$ connected in a delta configuration. Other implementations are possible, for example, in which the capacitor bank of the filter circuit 20 is configured in a "Y" configuration (e.g., capacitors $C_R$, $C_S$ and $C_T$ in FIGS. 5 and 6 below). Moreover, the individual capacitors of the filter circuit 20 can be constructed using a single capacitor components, or may be individually constructed as series and/or parallel combinations of multiple capacitive components in various embodiments, and are hereinafter collectively termed "filter capacitors".

The switching rectifier 30 includes switching devices S1-S6 individually coupled between a corresponding one of the AC input phases (u, v, w) and a corresponding DC bus terminal (+ or -) of the DC link circuit 40. A drive controller 60 includes a rectifier switching controller 62 that provides rectifier switching control signal 62a to the rectifier switches S1-S6 to cause the rectifier 30 to convert received three-phase AC input power to provide a DC voltage Vdc across a DC bus capacitance Cdc of the link circuit 40 using any suitable pulse width modulation (PWM) technique. Other embodiments are possible, for example, using passive rectifier circuitry 30.

The inverter 50 receives DC input power from the link circuit 40 and includes inverter switches S7-S12 individually coupled between one of the positive or negative DC bus terminals and a corresponding output phase connected to the motor load 6. The inverter switches S7-S12 are operated according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to the motor load 6.

The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc. The controller 60 can be any suitable hardware, processor-executed software, processor-executed firmware, programmable logic, analog circuitry, etc. or combinations thereof which provides control signals 62a, 66a for operating the rectifier 30 and the inverter 50, and may implement other functionality associated with operation of the motor drive 10. While the illustrated embodiment includes a switching inverter 50 and associated controller 66, other power converter configurations or embodiments are possible in which the DC power provided at the bus circuit 40 is provided as an output, wherein the inverter 50 and inverter switching controller 66 may be omitted.

The LCL filter circuit 20 in FIGS. 1 and 2 includes three series circuits individually connected between the power converter input 4 and the corresponding phase of the rectifier AC input. Each series circuit includes a pair of series-connected filter inductors, with the first circuit including inductor Lr connected between the first power converter input terminal and a first intermediate node "r", as well as a second filter inductor Lu connected between the intermediate node r and a first rectifier AC input node "u". Similarly, the second series circuit includes a first inductor Ls connected between the second motor drive input and a second intermediate node "s" and a second inductor Lv connected between the node s and the second rectifier input "v", as well as a third series circuit with first and second inductors Lt and Lw joined by a third intermediate node "t". In addition, the filter circuit 20 includes three capacitor circuit branches 22r, 22s and 22t respectively connecting the nodes r, s and t to a delta configuration of three filter capacitors $C_{RS}$, $C_{ST}$ and $C_{TR}$. In this delta-connected capacitor circuit, each filter capacitor is connected to two of the capacitor circuit branches 22 (e.g., line-to-line) as shown.

Other non-limiting embodiments are possible in which a CL filter circuit 20 is provided (not shown) for interfacing the motor drive 10 with the power source 2, directly or through a transformer 3, for instance, with the first filter inductors Lr, Ls and Lt omitted due to the inductance of the secondary windings of the transformer 3, and with the input terminals 4 and the capacitor circuit branches 22r, 22s and 22t being connected directly to the inductors Lu, Lv and Lw at the nodes r, s and t, respectively.

As seen in FIGS. 1 and 2, moreover, a degradation detection system 70 is operatively coupled with the filter circuit 20, including measurement circuitry 74a to sense or otherwise measure line-to-line voltages $V_{rs}$, $V_{st}$ and $V_{tr}$ across the filter capacitors $C_{RS}$, $C_{ST}$ and $C_{TR}$, for example, by sensing the voltages at the branch circuits 22 as illustrated.

In addition, the measurement circuitry 74a may include, or couple to, current sensors coupled to the branch circuits 22 to sense the filter circuit branch currents $I_r$, $I_s$ and $I_t$ flowing in the associated capacitor circuit branches 22r, 22s and 22t, respectively. One embodiment of the degradation detection system 70 is depicted in FIGS. 1 and 2, including a microprocessor element 71 along with an electronic memory 73, the comparator circuitry 72, a current computation component 74 and one or more thresholds 76. The degradation detection system 70 can be any suitable hardware, processor-executed software, processor-executed firmware, programmable logic, analog circuitry, etc. or combinations thereof which provides the described capacitor degradation detection functionality, which may include filtering, RMS computations, current computations and/or threshold comparison functionality in certain embodiments as set forth hereinafter, and the system 70 may be operative using one or more processor elements 71 executing computer executable instructions stored in an electronic memory 73 of the system 70.

As seen in FIGS. 1 and 2, the degradation detection system 70 may include one or more components, some of which may be implemented as software and/or firmware components in execution, programmable logic, etc., including digital current computation component 74b with analog-to-digital conversion 86, multiplication functions 88, summation functions 92 (including subtraction), RMS computation components 94, further summation components 96, comparators 72, and the memory 73 in certain embodiments may store one or more threshold values 76. The degradation detection system 70 in certain implementations provides one or more output signals or values 78 to identify a detected filter capacitor degradation condition in the filter circuit 20, which may include an indication that at least one capacitor $C_{RS}$, $C_{ST}$ and/or $C_{TR}$ of the filter circuit 20 is over capacitance or under capacitance, and/or which may selectively identify one or more specific capacitors of the filter circuit 20 as being degraded as set forth further hereinafter. In one implementation, as illustrated, the degradation detection signal 78 may be provided to the motor drive controller 60 to initiate one or more actions, such as shutting down the motor drive 10 and/or providing an alert or warning signal or other indication, for instance, to a user interface associated with the motor drive 10 and/or to a connected network (not shown).

As best seen in FIG. 2, the illustrated example includes measurement circuitry 74a as well as digital processing circuitry or processor-implemented logic 74b for current computation, as well as comparator function 72 to compare current change values 98 provided from the component 74b with one or more thresholds 76 for selective provision of one or more filter capacitor degradation condition signals or values 78, providing a non-limiting embodiment of the current computation component 74 in FIG. 1. In this embodiment, the system includes analog measurement circuitry 74a with differential amplifiers 82 measuring filter circuit line-to-line voltages $v_{rs}$, $v_{st}$ and $v_{tr}$, as well as analog low pass filter (LPF) circuits 84 operative to low pass filter the measured filter circuit voltages $v_{rs}$, $v_{st}$ and $v_{tr}$. In addition, current sensor inputs $i_r$, $i_s$ and $i_t$ are provided to low pass filter circuits 84 for filtering measured filter circuit branch currents sensed along the capacitor circuit branches 22a, 22b and 22c, respectively. In one possible implementation, the low pass filter circuits 84 have a cutoff frequency above the operating frequency of the system 10. For example, a cutoff frequency of approximately 80 Hz can be used for a motor drive system 10 operating from a 50 Hz or 60 Hz supply in one non-limiting embodiment.

Analog-to-digital converters 86 are provided for concurrent sampling and conversion of the measured filter circuit voltages $v_{rs}$, $v_{st}$ and $v_{tr}$ and filter branch currents $i_r$, $i_s$ and $i_t$, with the converters 86 providing converted digital values $v_{RS}$, $v_{ST}$ and $v_{TR}$ representing the line-to-line voltages provided to the capacitor bank, as well as converted digital values $i_R$, $i_S$ and $i_T$ representing the measured filter circuit branch currents. In this regard, the use of separate ADC stages 86 operating concurrently in the example of FIG. 2 for each of the measured values advantageously ensures that the resulting comparisons correspond with one another, and thus presents a significant advantage in detecting capacitor degradation compared to multiplexing the inputs to a single shared analog-to-digital converter.

The digital processing component 74b further includes a set of three multipliers 88 configured to compute nominal line-to-line filter circuit branch currents $i_{RS}$, $i_{ST}$ and $i_{TR}$ using the measured filter circuit voltages $v_{rs}$, $v_{st}$ and $v_{tr}$, a filter operating frequency ω, and at least one nominal capacitance value C (ωC 90 in FIG. 2). In the illustrated example, the component 74b computes the individual nominal line-to-line filter circuit branch currents $i_{RS}$, $i_{ST}$ and $i_{TR}$ via corresponding multipliers 88 as a product of the corresponding measured filter circuit voltage $v_{rs}$, $v_{st}$ and $v_{tr}$ multiplied by the filter operating frequency ω (e.g., radians) and the corresponding nominal capacitance value C (e.g., farads). In addition, summation components 92 convert the line-to-line filter circuit branch current values to the computed nominal line currents $i_{Rc}=i_{RS}-i_{ST}$, $i_{Sc}=i_{TR}-i_{RS}$, and $i_{Tc}=i_{Rc}-i_{Sc}$. In this regard, the inventors have appreciated that the measured line-to-line voltages in the delta configured capacitor bank circuit of the filter 20 can be used to compute the line-to-line nominal currents $i_{RS}$, $i_{ST}$ and $i_{TR}$ according to the nominal expected capacitance of the filter capacitors $C_{RS}$, $C_{ST}$ and $C_{TR}$ and the operating frequency ω, thereby facilitating computation via the summation components 92 of the corresponding nominal branch line current values $i_{RS}$, $i_{Sc}$ and $i_{Tc}$, which represent the current that should ideally be flowing in the branch lines 22 if the actual capacitances of the filter capacitors $C_{RS}$, $C_{ST}$ and $C_{TR}$ are at the nominal or expected levels.

As further seen in the embodiment of FIG. 2, RMS computation components 94 compute root-mean-square circuit branch current values $I_{Rm}$, $I_{Sm}$ and $I_{Tm}$ using the measured filter circuit branch currents $i_r$, $i_s$ and $i_t$, respectively, as well as root-mean-square nominal filter circuit branch current values $I_{Rm}$, $I_{Sm}$ and $I_{Tm}$ using the nominal filter circuit branch currents $I_{Rc}$, $I_{Sc}$ and $I_{Tc}$. Three current change values 98 including value 98R ($\Delta I_R$), 98S ($\Delta I_S$) and 98T ($\Delta I_T$) are computed via summation components 96 representing deviations of individual measured filter circuit branch currents $i_r$, $i_s$ and $i_t$ from the corresponding computed nominal filter circuit branch currents $I_{Rc}$, $I_{Sc}$ and $I_{Tc}$. In the illustrated example, the summation components 96 compute the individual current change values $\Delta I_R$, $\Delta I_S$ and $\Delta I_T$ as the difference between the corresponding RMS nominal filter circuit branch current value $I_{Rm}$, $I_{Sm}$ and $I_{Tm}$ and the corresponding RMS circuit branch current value $I_{Rm}$, $I_{Sm}$ and $I_{Tm}$, respectively, with $\Delta I_R=I_{Rc}-I_{Rm}$, $\Delta I_S=I_{Sc}-I_{Sm}$, and $\Delta I_T=I_{Tc}-I_{Tm}$. The degradation detection system 70 further operates to selectively identify one or more filter capacitor degradation conditions in the filter circuit 20 at least partially according to the current change values $\Delta I_R$, $\Delta I_S$ and $\Delta I_T$, and provides one or more detection signals or values 78 accordingly.

Referring also to FIG. 3, in the illustrated embodiment, the system 70 employs comparators 72 (which can be implemented in hardware, processor-executed software, processor-executed firmware, programmable logic, etc.) to compare the computed current change values $\Delta I_R$, $\Delta I_S$ and $\Delta I_T$ with one or more thresholds 76. FIG. 3 provides a graph 100 illustrating exemplary positive thresholds 76-1 (TH+) and 76-2 (2TH+), and negative thresholds 76-3 (TH−) and 76-4 (2TH−) of the degradation detection system 70 according to one embodiment. As seen in FIG. 3, the exemplary thresholds 76 define a first region 101 extending between thresholds 76-1 and 76-3 including 0, with the region 101 corresponding to an acceptable range on the values of the filter circuit capacitors $C_{RS}$, $C_{ST}$ and $C_{TR}$. In addition, the thresholds 76-1 and 76-2 define a second region 102, and the threshold 76-2 in this example defines a third region 103 above 2TH+. In the negative direction, the thresholds 76-3 and 76-4 define a fourth region 104, and the threshold 76-4 defines a further region 105 as shown. In this example, the second threshold 76-2 is equal to twice the value of the first threshold 76-1, although not a strict requirement of all embodiments. Similarly, the fourth threshold 76-4 is equal to twice the value of the third threshold 76-3, although other embodiments are possible in which this is not the case. Furthermore, the illustrated embodiment provides the first and third thresholds 76-1 and 76-3 having equal values of opposite polarity, although not a strict requirement of all embodiments of the present disclosure. Moreover, although the illustrated system 70 employs four thresholds 76-1 through 76-4, other implementations are possible using more or fewer thresholds. In addition, while threshold comparison techniques are employed via comparators 72 and thresholds 76 in the illustrated example, other suitable techniques and apparatus can be employed for selectively identifying filter capacitor degradation conditions in the filter circuit 20 in whole or in part according to the computed current change values $\Delta I_R$, $\Delta I_S$ and $\Delta I_T$.

Figure 4A:
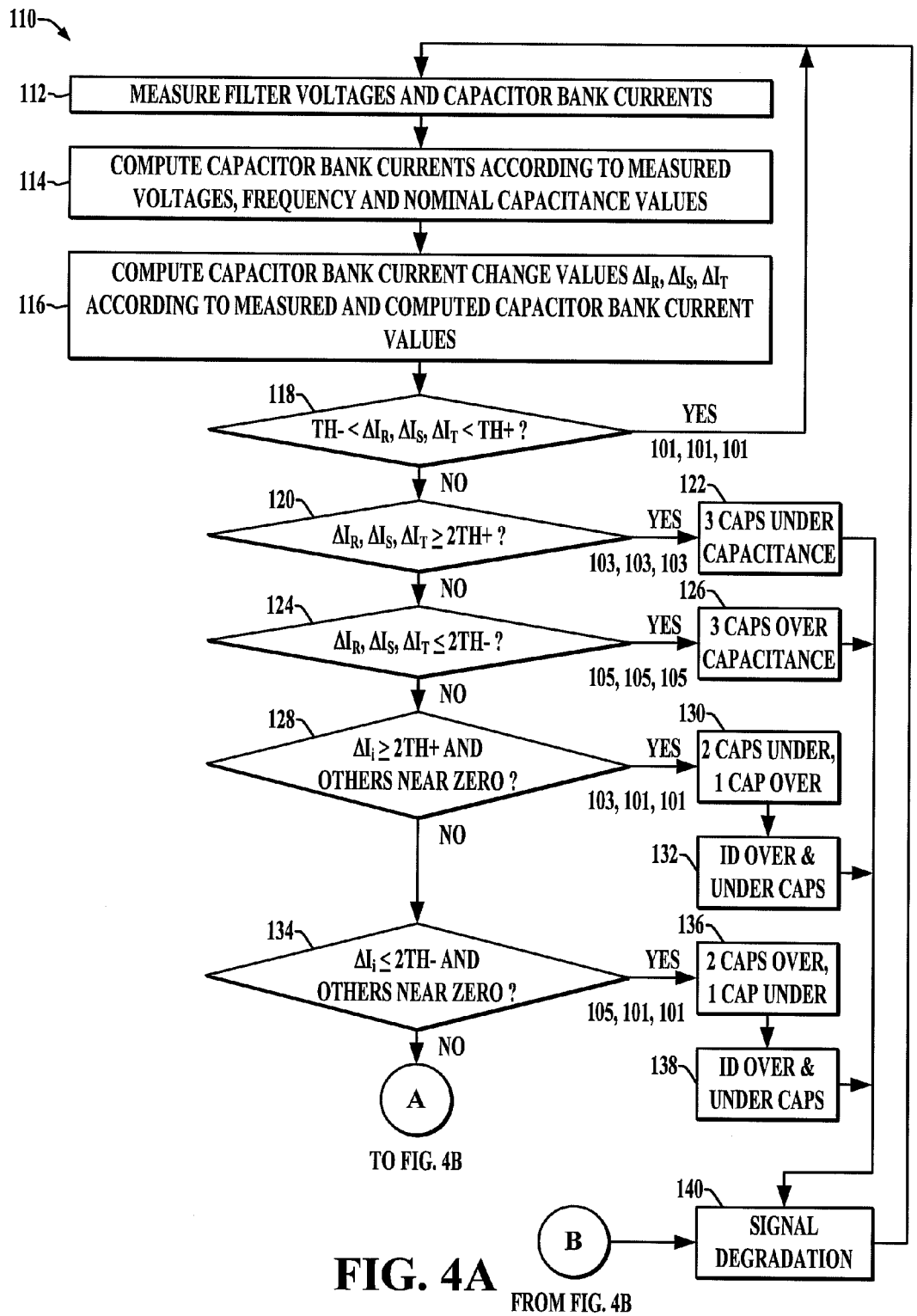
FIGS. 4A and 4B depict a flow diagram illustrating an exemplary process for detecting filter capacitor degradation according to one embodiment.
Figure 4B:
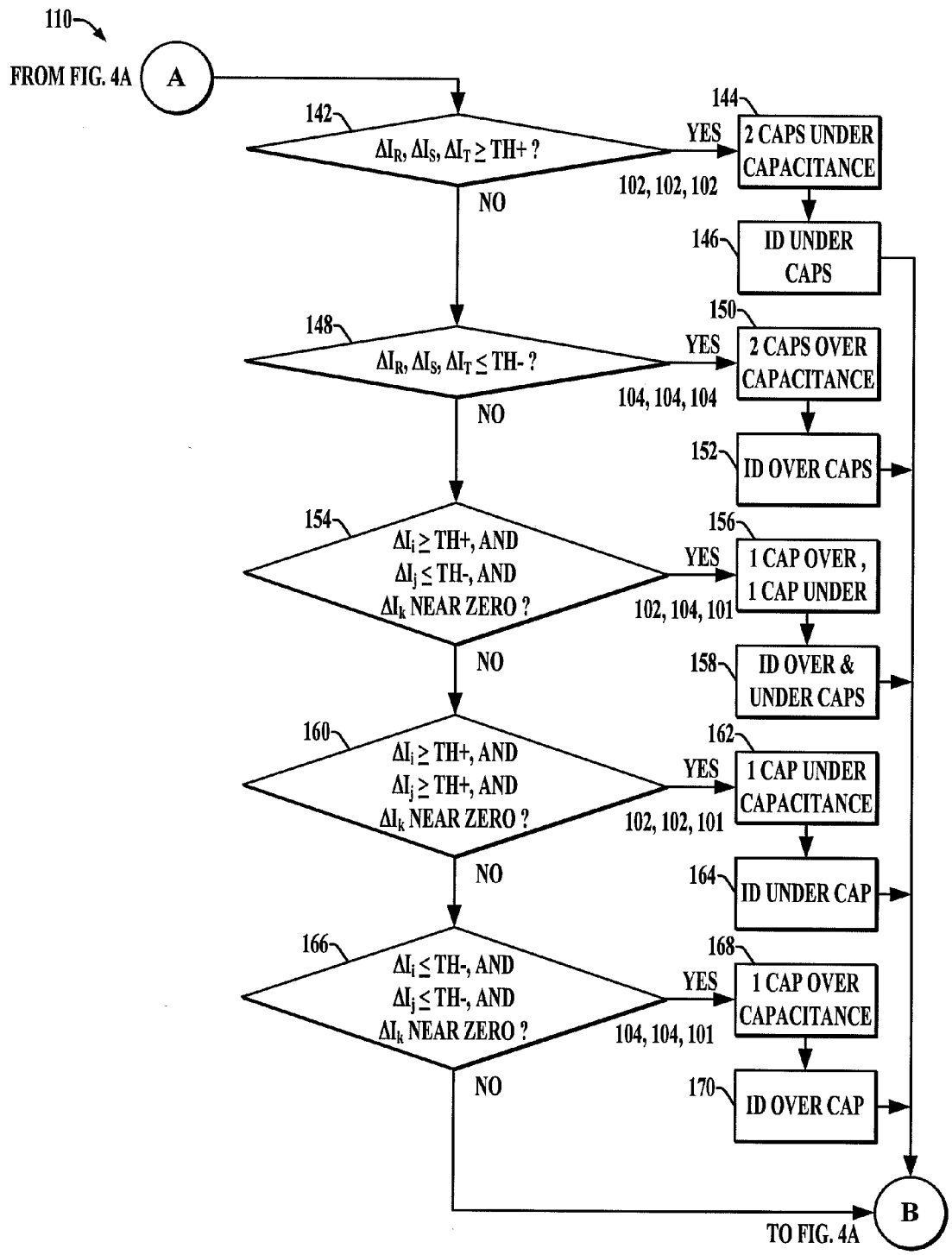

FIGS. 4A and 4B provide a flow diagram illustrating an exemplary process 110 for detecting filter capacitor degradation according to one embodiment. While the method 110 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or processor-executed firmware, or combinations thereof, and various embodiments or implementations include non-transitory computer readable mediums having computer-executable instructions for performing the illustrated and described methods. For example, the method 110 may be implemented by using analog circuitry 74a and a processor 71 as described herein using program instructions for filter capacitor degradation detection or identification, with various instructions and data being stored in the electronic memory 73 associated with the processor 71, although the method 110 can be implemented in other systems, including without limitation those illustrated and described herein.

The method 110 begins at 112 in FIG. 4A, with the filter voltages and capacitor bank currents being measured. In certain embodiments, these are measured concurrently, for example using corresponding analog-to-digital converters 86 as in FIG. 2 above. At 114 in FIG. 4A, capacitor bank currents are computed according to the measured voltages, the operating frequency, and one or more nominal capacitance values. In the example of FIG. 2 above, for instance, multipliers 88 compute line-to-line current values as the product of the line-to-line voltage values from the analog-to-digital converters 86, the operating frequency ω and the nominal capacitance value C corresponding to the nominal value of the filter capacitors $C_{RS}$, $C_{ST}$ and $C_{TR}$. In the above delta-connected capacitor bank filter circuit 20, moreover, the computation at 114 may further include deriving branch circuit line currents from the line-to-line computed currents, for example, using the summation components 92 in FIG. 2 above. At 116 in FIG. 4A, current change values are computed according to the measured and computed capacitor bank current values. FIG. 2 illustrates a non-limiting example, with the current change values 98 being computed via the summation components 96 as the differences $\Delta I_R = I_{Rc} - I_{Rm}$, $\Delta I_S = I_{Sc} - I_{Sm}$, and $\Delta I_T = I_{Tc} - I_{Tm}$.

As further seen in FIGS. 4A and 4B, the method 110 further includes selectively identifying a filter capacitor degradation condition in the filter circuit 20 at least partially according to the current change values 98. The determinations in FIGS. 4A and 4B can be performed using any suitable hardware, programmable logic, processor-executed software, etc. In the illustrated embodiment, for example, the current change values 98 are compared with one or more thresholds 76 via comparator 72 (FIG. 2), with the comparator functions 72 being implemented via the processor 71 using thresholds 76 stored in the electronic memory 73 (FIG. 1).

In the illustrated example, a determination is made at 118 in FIG. 4A as to whether the current change values $\Delta I_R$, $\Delta I_S$ and $\Delta I_T$ are each within the first region 101 in FIG. 3 (less than TH+ and greater than TH−). If so (YES at 118), the process 110 returns to 112, 114 and 116 to reevaluate the current change values as described above. In one possible embodiment, the thresholds TH+ and TH− are equal to one another, with opposite polarities, and are set to correspond to a predetermined amount of capacitor degradation. In the illustrated delta configuration of FIGS. 1 and 2, for example, TH+ and TH− may be set and stored in the electronic memory 73 to correspond to +/−10% current deviation, in turn corresponding to +/−20% deviation from the nominal filter capacitor values due to the delta configuration. In a Y configuration (e.g., FIGS. 5 and 6 below) TH+ and TH− may be set to +/−20% current deviation corresponding to +/−20% deviation from the nominal filter capacitor values. A positive determination at 118 that the current change values $\Delta I_R$, $\Delta I_S$ and $\Delta I_T$ are all within the first range 101 in FIG. 3 in this case indicates that no filter capacitor degradation is indicated, and the process 110 continues monitoring at 112-116.

If at least one current change values $\Delta I_R$, $\Delta I_S$ and/or $\Delta I_T$ is outside the range 101 (NO at 118), a determination is made at 120 as to whether all of the current change values $\Delta I_R$, $\Delta I_S$ and $\Delta I_T$ are greater than or equal to 2TH+ (i.e., all the current change values 98 are within the region 103 in FIG. 3 above). If so (YES at 120), the degradation detection system 70 determines that all three filter capacitors are under capacitance at 122 and provides a degradation indication via at least one signal or value 78 at 140 in FIG. 4A, before returning to continue monitoring at 112-116 as discussed above. In this case, the positive determination at 120 indicates that the filter currents $i_r$, $i_s$ and $i_t$ are each lower in the positive direction than they would have been had the filter capacitors $C_{RS}$, $C_{ST}$ and $C_{TR}$ been at their nominal capacitance values, thereby indicating that all three of the filter capacitors $C_{RS}$, $C_{ST}$ and $C_{TR}$ currently have capacitance values at least 20% lower than the nominal values, and the system 70 accordingly signals "under capacitance" degradation at 140. In certain embodiments, moreover, the identification of a filter capacitor degradation condition at 140 can provide an indication to the drive controller 60 and/or to an external device at 140, for example, via digital messaging, providing the identity of the filter capacitor or capacitors suspected of degradation, in this case all three capacitors $C_{RS}$, $C_{ST}$ and $C_{TR}$. In this manner, the system 70 facilitates expeditious system maintenance and troubleshooting by indicating to maintenance personnel which capacitor should be checked or replaced.

If all three current change values are not in the range 103 (NO at 120), the process 110 proceeds to make a determination at 124 in FIG. 4A as to whether all three current change values $\Delta I_R$, $\Delta I_S$ and $\Delta I_T$ are less than or equal to 2TH− (i.e., all the current change values 98 are within the region 105 in FIG. 3). If so (YES at 124), all three filter capacitors $C_{RS}$, $C_{ST}$ and $C_{TR}$ are determined to be "over capacitance" at 126, and the system 70 provides a corresponding degradation signal indication at 140. In this situation, the system 70 determines that the filter currents $i_r$, $i_s$ and $i_t$ are each greater in the negative direction than they would have been if the filter capacitors $C_{RS}$, $C_{ST}$ and $C_{TR}$ been at their nominal capacitance values, and thus all the capacitors $C_{RS}$, $C_{ST}$ and $C_{TR}$ currently have capacitance values at least 20% above the nominal values. In certain embodiments, the signal 78 can indicate the identities of all the capacitors suspected of the over capacitance condition.

If the system 70 determines at 118, 120 and 124 that the current change values are not within regions 101, 103 or 105 (NO at 124), a determination is made at 128 as to whether one of the current change values ($\Delta I_i$) is greater than or equal to 2TH+ (in region 103 of FIG. 3), and the other current change values ($\Delta I_j$ and $\Delta I_k$) are near zero (e.g., in region 101 in FIG. 3). If so (YES at 128), the system 70 determines at 130 that two of the filter capacitors are under capacitance, and the other filter capacitor is over capacitance. In the illustrated embodiment, moreover, the system identifies the over capacitance and under capacitance capacitors at 132, and then signals degradation at 140, where the signaling at 140 may include the identification of the over and under capacitance filter capacitors made at 132 in certain embodiments. In one embodiment for a system having delta-connected filter capacitors, the system 70 identifies the two capacitors having common connections at the circuit branch 22 corresponding to the branch current having the change value in the range 103 as being under capacitance, and the remaining filter capacitor as being over capacitance at 132, based on the configuration of the delta capacitor bank circuitry. In a Y filter capacitor configuration (e.g., FIGS. 5 and 6 below), the system 70 identifies the filter capacitor in series with the circuit branch 22 having the current change value in the range 103 as being over capacitance, and the remaining two filter capacitors as being under capacitance at 132.

If the conditions at 128 are not satisfied (NO at 128 in FIG. 4A), a determination is made at 134 as to whether one of the current change values ($\Delta I_i$) is less than or equal to 2TH− (in region 105 of FIG. 3), and the other current change values ($\Delta I_j$ and $\Delta I_k$) are near zero (e.g., in region 101 in FIG. 3). In this case (YES at 134), the system 70 determines at 136 that two of the filter capacitors are over capacitance, and one of the capacitors is under capacitance, and in certain embodiments identifies the over capacitance and under capacitance filter capacitors at 138 and provides a corresponding degradation indication at 140. In one delta-connected embodiment (e.g., FIG. 2) for instance, the system 70 determines at 138 that the two filter capacitors having a common connection at the circuit branch 22 for which the current change value is in the region 105 in FIG. 3 are under capacitance (e.g., their capacitance values are at least 20% lower than the nominal value), and identifies the remaining filter capacitor at 138 as having an over capacitance condition, and these identities and corresponding detected degradation conditions are signaled at 140. In the case of a Y-connected filter capacitor bank (e.g., FIGS. 5 and 6 below), the system 70 identifies the filter capacitor connected in series with the branch for which the current change value is in the range 105 as being under capacitance at 138, and identifies the other two filter capacitors as being over capacitance, and provides a corresponding degradation indications at 140, before the process returns to 112 as discussed above.

Otherwise (NO at 134 in FIG. 4A), the process 110 continues at 142 in FIG. 4B, with the system 70 making a determination as to whether all of the current change values $\Delta I_R$, $\Delta I_S$ and $\Delta I_T$ are greater than or equal to TH+, thereby indicating that all the current change values are within the region 102 in FIG. 3. In this case (YES at 142), the system 70 determines at 144 that two of the filter capacitors are under capacitance (e.g., capacitance values 20% or more below the nominal capacitance), and may identify the under capacitance filter capacitors at 146 and provide a corresponding signal or value indicating the identified degraded capacitors at 140 (FIG. 4A). If not (NO at 142 in FIG. 4B), a determination is made at 148 as to whether all of the current change values are less than or equal to TH− (in region 104 in FIG. 3). If so (YES at 148), the system 70 determines that two of the filter capacitors are over capacitance, identifies the over capacitance components at 152, and provides degradation signaling at 140 as described above.

Otherwise (NO at 148) the system 70 determines at 154 whether one of the current change values is within the region 102 (e.g., $\Delta I_i$ greater than or equal to TH+), another of the current change values is less than or equal to TH− (e.g., $\Delta I_j$ in region 104), and the remaining current change value ($\Delta I_k$) is near zero (e.g., in region 101 of FIG. 3 above). In this case, the system 70 determines at 156 that one filter capacitor is over capacitance and one filter capacitor is under capacitance, and identifies at 158 the over capacitance and under capacitance capacitors for appropriate signaling at 140. In the delta-connected example of FIG. 2, the capacitor connected between the circuit branches 22 for which the current change values 98 are in the regions 101 and 102 is identified as having an over capacitance degradation condition, and the filter capacitor connected between the circuit branches 22 for which the current change values 98 are in the regions 101 and 104 is identified at 158 as having an under capacitance degradation condition, and these identifications are reported in certain embodiments via the signaling at 140. For a Y-connected embodiment (e.g., FIGS. 5 and 6 below), the filter capacitor connected in the branch 22 having a current change value in the region 102 is identified at 158 as having an under capacitance condition, and the filter capacitor connected in the branch 22 having a current change value in the region 104 is identified at 158 as having an over capacitance condition, and these identities can be reported via the degradation indication at 140.

If the conditions at 154 in FIG. 4B are not met (NO at 154), a determination is made at 160 as to whether two of the current change values (e.g., $\Delta I_i$ and $\Delta I_j$) are greater than or equal to TH+(in region 102 of FIG. 3) and the remaining current change value (ΔI$_k$) is near zero (in region 101). If so (YES at 160), one capacitor is identified as having an under capacitance degradation condition at 162, and the system 70 identifies the particular degraded filter capacitor at 164. In the case of a delta-connected system (e.g., FIGS. 1 and 2), the system 70 identifies the filter capacitor connected to the circuit branches 22 having current change values 98 in the region 102 as having the under capacitance condition, and this identification is reported in certain embodiments with the degradation indication at 140 (FIG. 4A). For a Y-connected system (e.g., FIGS. 5 and 6), the system 70 identifies the filter capacitor connected in the branch 22 having the current change value near zero (e.g., region 101) as having an under capacitance condition at 164, and this identification is indicated in the signaling at 140 in certain embodiments.

If the conditions in 160 of FIG. 4B are not met (NO at 160), a determination is made at 166 as to whether two of the current change values are less than or equal to TH− (region 104 in FIG. 3) and the remaining current change value is near zero (e.g., region 101). If so (YES at 166), the system 70 determines that one of the filter capacitors has an over capacitance degradation condition at 108, and identifies the particular filter capacitor having this degradation at 170. In the delta-connected example, the system 70 identifies the filter capacitor connected to the branches 22 having the current change values 98 in the region 104 as having the over capacitance condition at 170, and this identity and the degradation condition are reported in certain embodiments at 140 as described above. In the Y-connected example, the system 70 identifies the filter capacitor connected to the branch circuit 22 having the current change value in the region 101 (e.g., near zero) as having the over capacitance degradation condition at 170, and this information is reported at 140.

If the conditions in 118, 120, 124, 128, 134, 142, 148, 154, 160 and 166 are not met (NO at 166 in FIG. 4B), the process 110 returns to signal a degradation condition at 140 in FIG. 4A, and the process returns to 112 as previously described to continue monitoring the condition of the capacitors in the filter circuit 20.

Figure 5:
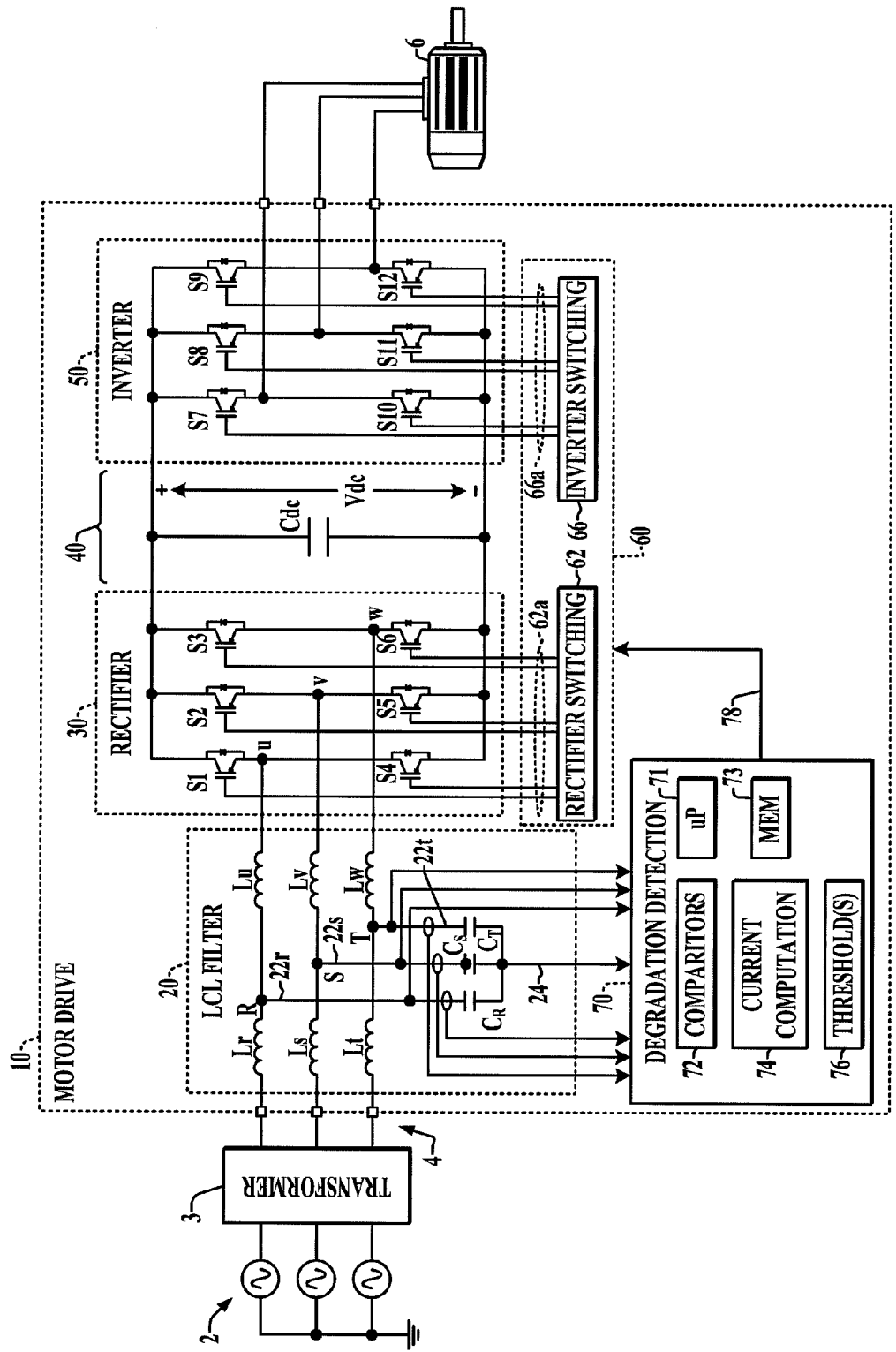
FIG. 5 is a schematic diagram illustrating another exemplary AFE motor drive with an input LCL filter having Y-connected filter capacitors, and a degradation detection system according to one embodiment.
Figure 6:
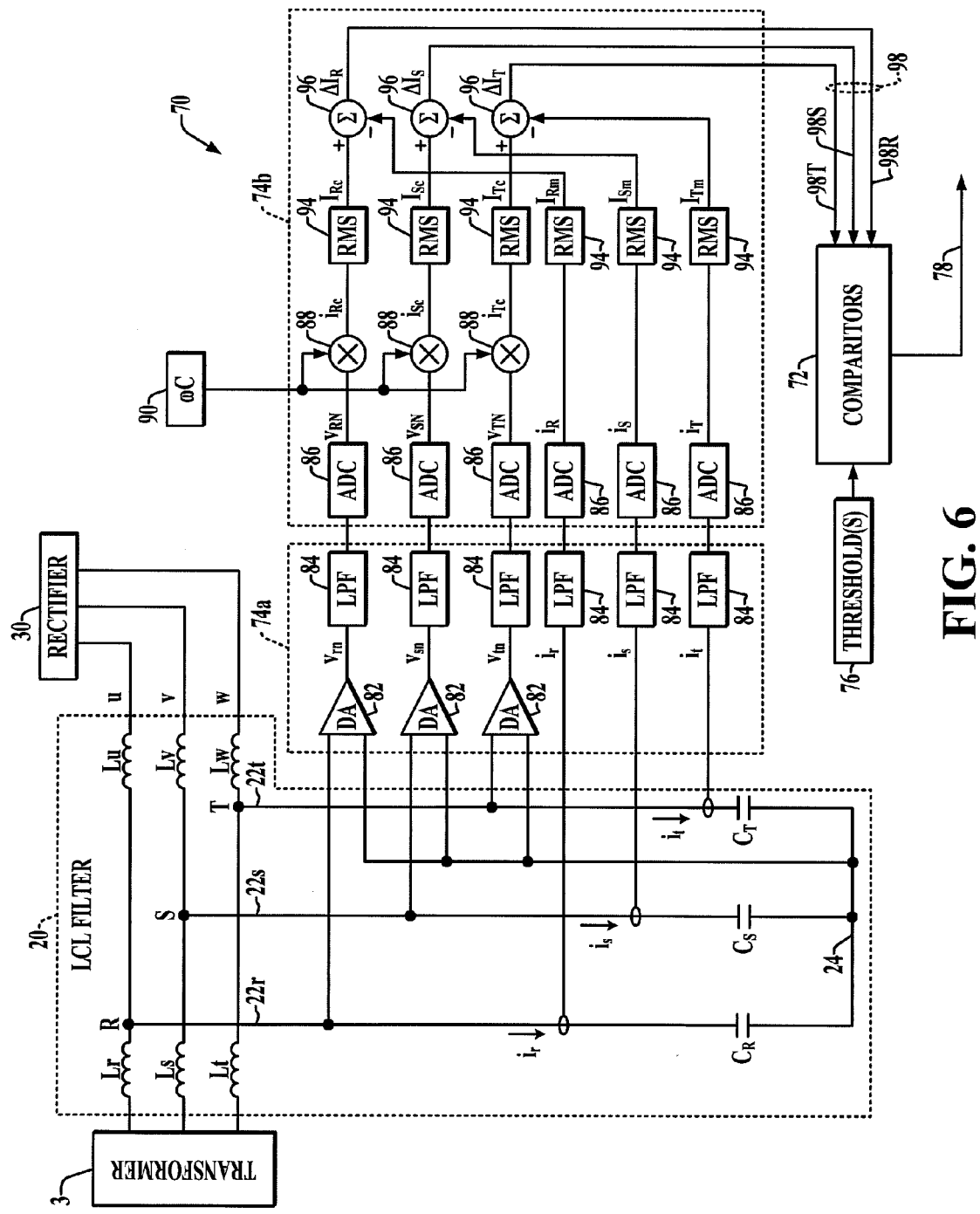
FIG. 6 is a partial schematic diagram illustrating further details of an exemplary degradation detection system in the motor drive of FIG. 5 according to one embodiment.

Referring also to FIGS. 5 and 6, another motor drive power converter embodiment 10 is shown, including an LCL filter circuit 20, a rectifier 30, intermediate DC link circuit 40 and inverter 50 operated by a motor drive controller 60 generally as described above to power a motor or other AC load 6 using power from an AC input source 2. The LCL filter 20 in this embodiment includes series circuits individually including two series-connected inductors (Lr and Lu, etc.) with corresponding capacitor circuit branches 22 connecting the series circuits with three filter capacitors C$_R$, C$_S$ and C$_T$ connected in a Y configuration with each filter capacitor C connected between a corresponding one of the capacitor circuit branches 22 and a common connection node 24 (e.g., a neutral node). Other embodiments are possible in which the filter circuit 20 is an L-C configuration with only a single inductor in each of the series circuits, such as where the motor drive 10 is used in combination with an input transformer 3, in which case the inductors Lr, Ls and Lt can be omitted. The exemplary circuit 74a is constructed in generally the same manner as that shown in FIG. 2 above, with the differential amplifiers 82 measuring line-neutral voltages V$_{rn}$, V$_{sn}$ and V$_{tn}$ instead of line-to-line voltages as was the case in the delta-connected configuration of FIGS. 1 and 2. These voltages and the measured branch currents i$_r$, i$_s$ and i$_t$ are low pass filtered via filter circuits 84 and converted to digital form via the analog-to-digital converters 86. In certain embodiments, the converters 86 operate concurrently to sample and convert the corresponding voltages and currents, with the converted voltages representing line-to-neutral voltages V$_{RN}$, V$_{SN}$ and V$_{TN}$ as shown in FIG. 6. These voltages are multiplied via multiplier components 88 by the operating frequency and the nominal capacitance values 90 (ωC) and RMS values are computed via components 94 to provide computed nominal currents I$_{Rc}$, I$_{Sc}$ and I$_{Tc}$ from which the measured values I$_{Rm}$, I$_{Sm}$ and I$_{Tm}$ are subtracted via subtractor components 96 to provide the current change values 98 to the comparators 72 for comparison with the threshold(s) 76 as described above.

The filter capacitor degradation detection system 70 in this case operates as described above in connection with FIGS. 4A and 4B with the system 70 measuring filter circuit branch currents and voltages associated with the filter 20, computing nominal filter circuit branch currents using the measured voltages, the filter operating frequency and one or more nominal capacitance values, and computing the current change values representing deviations of the individual measured filter circuit branch currents from the corresponding nominal filter circuit branch currents. The system 70 selectively identifies one or more filter capacitor degradation conditions in the filter circuit 20 at least partially according to the current change values as discussed above. As previously noted, moreover, the system may employ different threshold values 76 for a Y-connected filter circuit capacitor bank, where the current change value thresholds 76 may be set according to a predetermined amount (e.g. 20% in one example) of tolerable variation in the capacitance value of the filter circuit capacitors C$_R$, C$_S$ and C$_T$.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A method for detecting capacitor degradation in a filter circuit, the method comprising:
measuring a plurality of filter circuit branch currents associated with the filter circuit;
measuring a plurality of filter circuit voltages associated with the filter circuit;
computing a plurality of nominal filter circuit branch currents using the measured plurality of filter circuit voltages, a filter operating frequency, and at least one nominal capacitance value;
computing a plurality of current change values representing deviations of individual measured filter circuit branch currents from a corresponding nominal filter circuit branch currents;
selectively identifying a filter capacitor degradation condition in the filter circuit at least partially according to the current change values;
computing root-mean-square (RMS) circuit branch current values using the measured plurality of filter circuit branch currents;
computing root-mean-square (RMS) nominal filter circuit branch current values using the nominal filter circuit branch currents; and
computing individual current change values as a difference between a corresponding RMS nominal filter circuit branch current value and a corresponding RMS circuit branch current value.

2. The method of claim 1, wherein the plurality of filter circuit branch currents and the plurality of filter circuit voltages are measured concurrently.

3. The method of claim 1, comprising low pass filtering the measured plurality of filter circuit branch currents and the measured plurality of filter circuit voltages.

4. The method of claim 3, wherein individual nominal filter circuit branch currents are computed as a product of a corresponding measured filter circuit voltage, the filter operating frequency, and a corresponding nominal capacitance value.

5. The method of claim 1, wherein measuring the plurality of filter circuit voltages associated with the filter circuit comprises measuring a plurality of line-line filter circuit voltages between a plurality of circuit branch lines of the filter circuit.

6. The method of claim 5, comprising:
computing individual nominal filter circuit branch currents as a product of a corresponding measured filter circuit voltage, the filter operating frequency, and a corresponding nominal capacitance value.

7. The method of claim 1, comprising:
computing individual nominal filter circuit branch currents as a product of a corresponding measured filter circuit voltage, the filter operating frequency, and a corresponding nominal capacitance value.

8. The method of claim 7, wherein the plurality of filter circuit branch currents and the plurality of filter circuit voltages are measured concurrently.

9. The method of claim 1, wherein selectively identifying a filter capacitor degradation condition in the filter circuit comprises determining that at least one capacitor of the filter circuit as being over capacitance or under capacitance at least partially according to the current change values.

10. The method of claim 1, comprising selectively identifying at least one specific capacitor of the filter circuit as being degraded at least partially according to the current change values.

11. A non-transitory computer readable medium, comprising computer executable instructions for:
computing a plurality of nominal filter circuit branch currents using a plurality of measured filter circuit voltages, a filter operating frequency, and at least one nominal capacitance value;
computing a plurality of current change values representing deviations of individual measured filter circuit branch currents from corresponding nominal filter circuit branch currents;
selectively identifying a filter capacitor degradation condition in filter circuit at least partially according to the current change values;
computing root-mean-square (RMS) circuit branch current values using the measured plurality of filter circuit branch currents;
computing root-mean-square (RMS) nominal filter circuit branch current values using the nominal filter circuit branch currents; and
computing individual current change values as a difference between a corresponding RMS nominal filter circuit branch current value and a corresponding RMS circuit branch current value.

12. The non-transitory computer readable medium of claim 11, comprising computer executable instructions for:
computing individual nominal filter circuit branch currents as a product of a corresponding measured filter circuit voltage, the filter operating frequency, and a corresponding nominal capacitance value.

13. A power converter, comprising:
a power converter input operative to receive multiphase AC input power;
an active front end rectifier;
a filter circuit coupled between the power converter input and the AFE rectifier, the filter circuit comprising first, second, and third series circuits individually including at least one filter inductor coupled between a corresponding phase of the power converter input and a corresponding phase of the three phase AC input of the AFE rectifier, first, second, and third capacitor circuit branches respectively connected to the first, second and third series circuits, and three filter capacitors with each filter capacitor being connected to at least one of the capacitor circuit branches;
a measurement circuit operatively coupled with the input filter circuit to measure a plurality of filter circuit branch currents associated with the filter circuit and a plurality of filter circuit voltages associated with the filter circuit; and
at least one processor programmed to:
compute a plurality of nominal filter circuit branch currents using the measured plurality of filter circuit voltages, a filter operating frequency, and at least one nominal capacitance value,
compute a plurality of current change values representing deviations of individual measured filter circuit branch currents from corresponding nominal filter circuit branch currents,
selectively identify a filter capacitor degradation condition in the filter circuit at least partially according to the current change values,
compute root-mean-square (RMS) circuit branch current values using the measured plurality of filter circuit branch currents,
compute root-mean-square (RMS) nominal filter circuit branch current values using the nominal filter circuit branch currents, and compute individual current change values as a difference between a corresponding RMS nominal filter circuit branch current value and a corresponding RMS circuit branch current value.

14. The power converter of claim 13, comprising a plurality of analog to digital converter circuits configured to concurrently sample and convert the plurality of filter circuit branch currents and the plurality of filter circuit voltages.

15. The power converter of claim 14, comprising low pass filter circuitry configured to low pass filter the measured plurality of filter circuit branch currents and the measured plurality of filter circuit voltages prior to analog to digital conversion.

16. The power converter of claim 13, wherein the at least one processor is programmed to compute individual nominal filter circuit branch currents as a product of a corresponding measured filter circuit voltage, the filter operating frequency, and a corresponding nominal capacitance value.

17. The power converter of claim 13, wherein the measurement circuit comprises a differential amplifier circuitry to measure the plurality of filter circuit voltages as a plurality of line-line filter circuit voltages between a plurality of circuit branch lines of the filter circuit.

\* \* \* \* \*